United States Patent [19]

Rucker, III

[11] 4,451,747
[45] May 29, 1984

[54] HIGH SPEED CLAMP CIRCUIT

[75] Inventor: Lucien M. Rucker, III, Arlington, Tex.

[73] Assignee: Bell Telephone Laboratories, Incorporated, Murray Hill, N.J.

[21] Appl. No.: 337,989

[22] Filed: Jan. 8, 1982

[51] Int. Cl.³ ............................................. H03K 5/08
[52] U.S. Cl. .................................. 307/549; 307/555; 307/567
[58] Field of Search ............... 307/540, 542, 549, 552, 307/555, 567, 313; 361/56, 91

[56] References Cited

U.S. PATENT DOCUMENTS 3,416,043  12/1968  Jorgensen ........................... 317/234
3,654,530  4/1972   Lloyd .............................. 317/235 R
4,027,177  5/1977   Davis .................................. 307/237
4,358,689  11/1982  Jarrett et al. ......................... 307/555

Primary Examiner—John Zazworsky
Attorney, Agent, or Firm—H. W. Lockhart; Wendy W. Koba

[57] ABSTRACT

A clamping circuit comprises a first transistor having a first and a second resistor shunting the base-collector and base-emitter junctions, respectively, and a second transistor opposite in polarity to the first transistor which has its emitter connected to the base of the first transistor. Externally, the clamping circuit has a connection from the collector of the first transistor to a first voltage level terminal, from the emitter of the first transistor to a voltage output terminal, and from the base of the second transistor to a reference voltage terminal. A second voltage level terminal is provided to which portions of the circuit, including the emitter of the first transistor and the collector of the second transistor, are connected.

8 Claims, 1 Drawing Figure

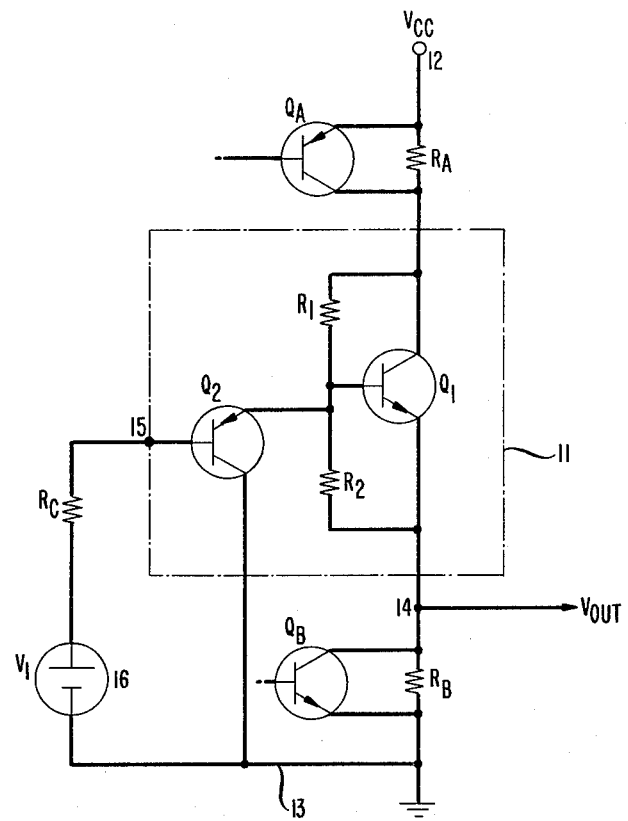

2

HIGH SPEED CLAMP CIRCUIT

BACKGROUND OF THE INVENTION

This invention relates to a voltage clamping circuit and more particularly, to a circuit for limiting the voltage at an output terminal so that it does not rise above a specified reference value.

Voltage limiting or clamping circuits are well known. Typically in such circuits, a semiconductor diode is connected between the circuit to be clamped and a fixed voltage reference. When clamping action occurs, the diode conducts heavily and, disadvantageously, a large supply current flows. In another known approach, active clamping elements use a feedback arrangement and thereby avoid loading of the power supply but, consequently, are slower and are likely to evidence stability problems dependent on the load or the supply or both.

Accordingly, there is a need for a clamping circuit in which the output voltage is relatively independent of the supply voltage, has low and controllable output resistance, minimal perturbation of power supply currents when clamping occurs, and further enjoys some degree of temperature compensation.

SUMMARY OF THE INVENTION

In accordance with an embodiment of the invention, a clamping circuit comprises a first transistor having a first and a second resistor shunting the base-collector and base-emitter junctions, respectively, and a second transistor opposite in polarity to the first transistor which has its emitter connected to the base of the first transistor. Externally, the clamping circuit has a connection from the collector of the first transistor to a first voltage level terminal, from the emitter of the first transistor to a voltage output terminal, and from the base of the second transistor to a reference voltage terminal. A second voltage level terminal is provided to which portions of the circuit are connected.

In the voltage clamping mode, this circuit limits the magnitude of the voltage at the output terminal to a particular value which is related to the reference voltage. If a suitable load is included, this value is the reference voltage. Thus, an increase in the magnitude of the first voltage level raises the voltage a small amount at the base of the first transistor and, correspondingly, at the emitter of the second transistor. The second transistor conducts and supplies current to enable an increased voltage drop across the first resistor in the base-collector circuit of the first transistor. The voltage change at the base of the first transistor is relatively small, so this voltage is substantially constant at one $V_{BE}$ above the reference voltage. The voltage at the output voltage terminal is likewise relatively constant at one $V_{BE}$ below the voltage at the base of the first transistor. When clamp action occurs and the supply voltage increases, the increased supply current is only that required to increase the voltage across the first resistor plus the normal load current. This current is small compared to that drawn by a conventional diode clamp of the prior art.

To enhance the speed of response, this clamping circuit readily can be arranged so that the first transistor is always active; that is, neither off nor saturated. Consequently, when such an arrangement is included, the circuit would not be subject to the delays occasioned by turn-on and turn-off times.

Moreover, when the output voltage is clamped to the reference voltage, the temperature coefficients of the base-emitter junctions of the two transistors which are of opposite polarity will substantially cancel each other so that the temperature coefficient of the output voltage as compared to the reference voltage can be made relatively small.

BRIEF DESCRIPTION OF THE DRAWING

The invention and its objects and features will be more clearly understood from the following detailed description taken in conjunction with the drawing which shows a circuit schematic of an embodiment of the invention.

DETAILED DESCRIPTION

The drawing shows a circuit schematic including a portion encompassed by the dotted outline 11 which constitutes the basic elements of the clamping circuit. These elements comprise a first transistor $Q_1$ having its collector connected to a first voltage level terminal 12 and its emitter connected to an output voltage terminal 14 and to a second voltage level terminal 13. A second transistor $Q_2$ has its emitter connected to the base of the first transistor $Q_1$ and its collector connected to the second voltage level terminal 13, which may be ground or other voltage level appropriate to the voltage at the first voltage level terminal 12. In the clamping circuit configuration, transistors $Q_1$ and $Q_2$ are of opposite polarity, and in this specific embodiment, may be npn and pnp, respectively.

Shunting the base collector junction of the first transistor $Q_1$ is a resistor $R_1$, and likewise shunting the base emitter junction is a resistor $R_2$. The node 15 which is connected to the base of the second transistor is referred to as a reference voltage terminal to which is connected a fixed voltage source 16 which provides a voltage $V_1$ and which has an associated internal resistance represented by the resistor $R_C$.

The clamp shown in this embodiment limits the positive-going voltage swing at the output terminal 14 to a value approximately equal to $V_1$ as generated by the voltage source 16 or other suitable source. If the polarity of the transistors and applied voltages is reversed, the limiting will apply to a negative-going voltage swing. Resistor $R_A$ between the first voltage level terminal 12 and the collector of the first transistor, and resistor $R_B$ between the output voltage terminal 14 and the second voltage level terminal 13, are components external to the clamp provided to assure that the first transistor is biased in the active normal region at all times. Advantageously, resistors $R_A$ and $R_B$ are shunted by transistors $Q_A$ and $Q_B$, respectively. In the operation of this clamping circuit, when the output voltage is in a low or most negative state, transistor $Q_B$ is driven at its base by external circuitry, well known in the art (not shown in the drawing), to be in the ON state, and transistor $Q_A$ likewise driven at its base by external circuitry, well known in the art (not shown), to be in the OFF state. It is to be understood that the external biasing circuitry associated with transistors $Q_A$ and $Q_B$, which is not illustrated for the sake of clarity, may comprise any biasing arrangement well known in the art and remain within the spirit and scope of the present invention. The voltage across resistor $R_2$ is equal to the base emitter voltage $V_{BEQ1}$ of the first transistor $Q_1$. This results in a voltage at the emitter of the second transistor $Q_2$ which is more negative than the reference voltage $V_1$, and therefore the second transistor $Q_2$ is in the OFF state. The current through resistor $R_1$ is unimportant in this condition, except that it is sufficient to keep the first transistor $Q_1$ biased in the ON condition. In this situation, the current through resistor $R_2$ is equal to the current through resistor $R_1$ minus the base current of the first transistor. The values of resistors $R_1$ and $R_2$ are chosen so that the current in $R_2$ is substantially larger than the base current of the first transistor $Q_1$. In a typical integrated circuit application, $R_1$ is 1.3 K$\Omega$ and $R_2$ is 1.5 K$\Omega$.

When the output voltage is at a high, most positive level, two conditions are possible. If transistor $Q_B$ is OFF and transistor $Q_A$ as controlled by the external circuitry associated with transistors $Q_B$ and $Q_A$ is ON, and the first voltage level is relatively low, then the base of the first transistor $Q_1$ is at a level which keeps the second transistor $Q_2$ OFF. For this condition, the voltage at the base of the first transistor $Q_1$ may be expressed as $$V_{BQ1} = V_{CC} - (I_{BQ1} + I_{R2})R_1 \qquad (1)$$

The first transistor $Q_1$ operates in a manner commonly referred to as a $V_{BE}$ multiplier, in which the voltage $V_{CEQ1}$ across the collector-emitter of the first transistor $Q_1$, essentially is fixed. Since the voltage across transistor $Q_A$ when ON is negligible, then the output voltage is equal to the difference between the first voltage level, $V_{CC}$, and the substantially fixed voltage $V_{CEQ1}$ across the collector-emitter of the first transistor $Q_1$, and thus the output voltage $V_{OUT}$ follows changes in the voltage $V_{CC}$. This is the mode of operation when the output voltage is below the desired clamp level.

The second and limiting mode of operation occurs when the supply voltage, $V_{CC}$, increases, causing the voltage $V_{BQ1}$ at the base of the first transistor $Q_1$ and therefore at the emitter of the second transistor $Q_2$ to increase, thus turning the second transistor $Q_2$ ON. The second transistor $Q_2$ then supplies current to increase the voltage drop across the first resistor $R_1$ and thereby to increase the voltage $V_{CEQ1}$ across the collector-emitter circuit of the first transistor $Q_1$. As the supply voltage $V_{CC}$ varies, the voltage $V_{BQ1}$ at the base of the first transistor $Q_1$ is relatively constant at one $V_{BE}$ above the reference voltage $V_1$, and the output voltage $V_{OUT}$ is one $V_{BE}$ below the voltage $V_{BQ1}$ at the base of the first transistor $Q_1$. Therefore, the output voltage $V_{OUT}$ is approximately equal to the reference voltage $V_1$. In practice, any voltage source will have some resistance which is represented in this embodiment by the resistor $R_C$, and the output resistance of the clamp circuit may be written $$R_{OUT} = r_{e1} + \frac{r_{e2}}{\beta_1 + 1} + \frac{R_C}{(\beta_1 + 1)(\beta_2 + 1)} \approx r_{e1} \qquad (2)$$

where $r_e$ is the incremental emitter resistance of the transistor indicated by the subscript numeral.

The rejection of supply voltage variations may be shown to be $$dV_{OUT}/dV_{CC} = R_C/((\beta_1 + 1)R_1 + R_C). \qquad (3)$$

In the embodiment thus described, the transistor $Q_A$ can be omitted but when included, provides a very high speed response. The transistor $Q_A$ provides an active pull-up, which normally would be used in a circuit of this type. However, the circuit will function properly with only the resistor $R_A$.

The polarity of transistors $Q_A$ and $Q_B$ is not critical. It is also within the skill of the art to utilize emitter scaling to accommodate the specific currents drawn by the various transistors.

As previously noted, when the circuit is in the clamping mode, the increased supply current is relatively small compared to that associated with conventional diode clamps. Moreover, with the first transistor $Q_1$ always in the active condition, delay times associated with turn-on and turn-off of the clamp components are not a consideration. The temperature compensation afforded by the oppositely poled emitter junctions of the two transistors also has been previously alluded to. Finally, the pair of complementary transistors utilized in this clamping circuit are advantageously realized in integrated circuit form in the complementary bipolar integrated circuit technology such as is disclosed in U.S. Pat. No. 4,087,900 to A. A. Yiannoulos.

What is claimed is:

1. A circuit in which the magnitude of the voltage at an output terminal does not exceed a particular value related to a reference voltage comprising
    (1) first and second transistors of opposite polarity having the base of the first transistor connected to the emitter of the second transistor;
    (2) a first resistance means connected between the collector and base of the first transistor and a second resistance means connected between the emitter and base of the first transistor;
    (3) a first voltage level terminal connected to the collector of the first transistor;
    (4) a voltage output terminal connected to the emitter of the first transistor;
    (5) a reference voltage terminal connected to the base of the second transistor.

2. A circuit in accordance with claim 1 including a second voltage level terminal having the emitter of the first transistor and the collector of the second transistor connected thereto.

3. A circuit in accordance with claim 2 including first biasing means connected between the collector of the first transistor and the first voltage level terminal.

4. A circuit in accordance with claim 2 including second biasing means connected between the emitter of the first transistor and the second voltage level terminal.

5. A circuit in accordance with claim 3 in which the first biasing means comprises a resistor.

6. A circuit in accordance with claim 5 in which a pull-up transistor is connected in parallel with the first biasing resistor.

7. A circuit in accordance with claim 4 in which the second biasing means comprises a resistor.

8. A circuit in accordance with claim 7 in which a pull-down transistor is connected in parallel with the second biasing resistor.

* * * * *